INVENTOR
RUSSELL E. FREDRICK
BY
Carpenter, Abbott, Coulter & Kinney
ATTORNEYS

THERMOELECTRIC ALLOYS AND ELEMENTS

Filed Aug. 21, 1958 2 Sheets-Sheet 2

INVENTOR
RUSSELL E. FREDRICK
BY
Carpenter, Abbott, Coulter & Kinney
ATTORNEYS 3,020,326

THERMOELECTRIC ALLOYS AND ELEMENTS

Russell E. Fredrick, White Bear Lake, Minn., assignor to Minnesota Mining and Manufacturing Company, St. Paul, Minn., a corporation of Delaware Filed Aug. 21, 1958, Ser. No. 756,462
10 Claims. (Cl. 136—5)

Figure 1:
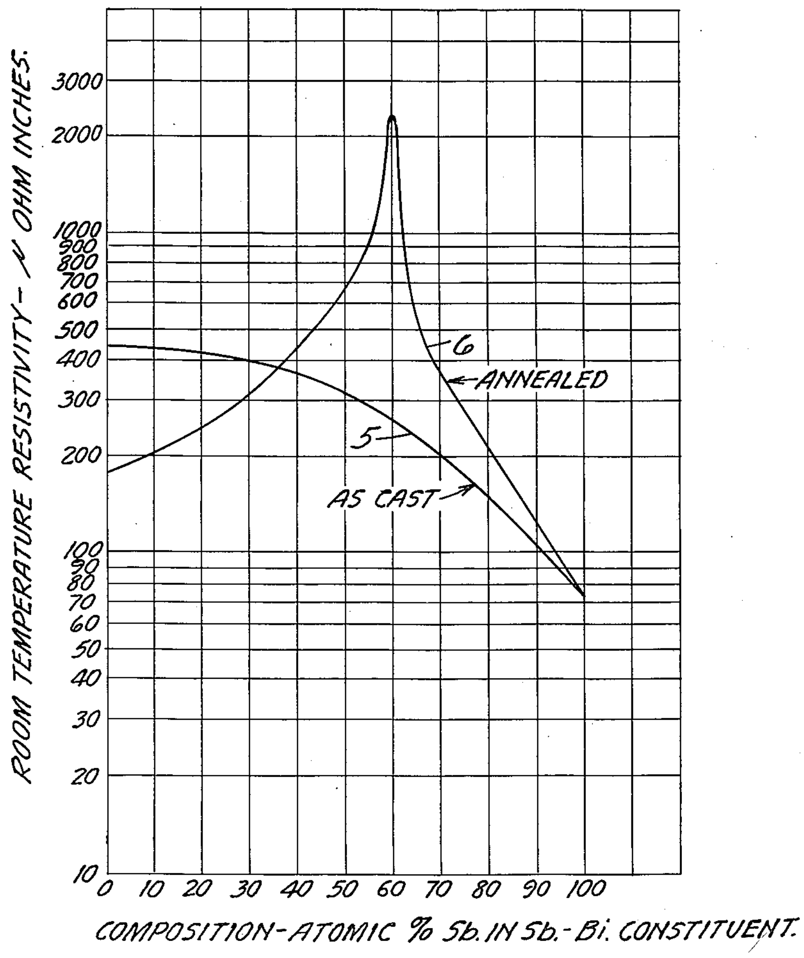

The present invention relates to thermoelectric elements and the method of making such elements. More particularly, the invention relates to thermoelectric elements formed of alloys affording to devices in which they are embodied superior operating characteristics.

While the improved thermoelectric elements to be described find particular utility in thermoelectric devices exploiting Peltier effect, the use of such elements in thermoelectric devices exploiting Seebeck effect is equally within the inventive concept, since such elements also have substantial utility in the latter type of device.

A general object of the present invention is to provide an improved thermoelectric element having superior heat pumping characteristics.

Another object of the invention is to provide an improved thermoelectric element of the aforementioned character having P-type electrical conductivity.

Another object of the invention is to provide an improved thermoelectric alloy having desirable relationships of thermoelectric power and electrical resistivity and which is reproducible within desired ranges of said relationships.

A further object of the invention is to provide an improved thermoelectric element of the class described which is formed of stable alloys and which can be readily prepared by techniques which lend themselves to economical manufacture.

The primary requisites of a good thermoelectric material are high thermoelectric power and low electrical resistivity. Since these properties are interdependent, it is convenient to compare materials by evaluating the factor $Q^2/\rho$ which I shall call the "Power Number," as this term is a measure of the composition's ability to pump heat in the exploitation of the Peltier effect.

My observations based on experimental and theoretical considerations indicate that for a given P-type thermoelectric power the resistivity of materials in the tellurium-antimony-bismuth alloy system decreases monotonically as the concentration of antimony is increased. However, alloys of this system which are high in antimony have not been attractive for use in thermoelectric elements because the thermoelectric power thereof has been too low to have any practical utility.

I have found that by the addition of tellurium beyond the demands of stoichiometric proportions, coupled with an appropriate heat treatment, certain alloys of the aforementioned system which would otherwise have low thermoelectric power are caused to exhibit both high thermoelectric power and low electrical resistivity characteristic of superior thermoelectric heat pump materials. Moreover, these superior thermoelectric materials are of P-type electrical conductivity.

The compositions of which the thermoelectric elements of the present invention are formed may be characterized in a number of ways. They may be characterized as ternary alloys of antimony, bismuth and tellurium; and they may also be characterized as alloys of two intermetallic compounds (antimony telluride and bismuth telluride) having a common elemental constituent (tellurium) which is present in an amount in excess of the stoichiometric proportion required for molecular combination with the other two constituents (antimony and bismuth). These compositions may also be characterized as solid solutions of two binary intermetallic compounds (antimony telluride and bismuth telluride) in which there is a small stoichiometric excess of tellurium.

The compositions within the scope of the present invention include tellurium-antimony-bismuth alloys in which tellurium is present within the range of 60.01 to 61.16 atomic percent, substantially all of the balance being an antimony-bismuth constituent containing 65 to 90 atomic percent antimony.

Figure 3:
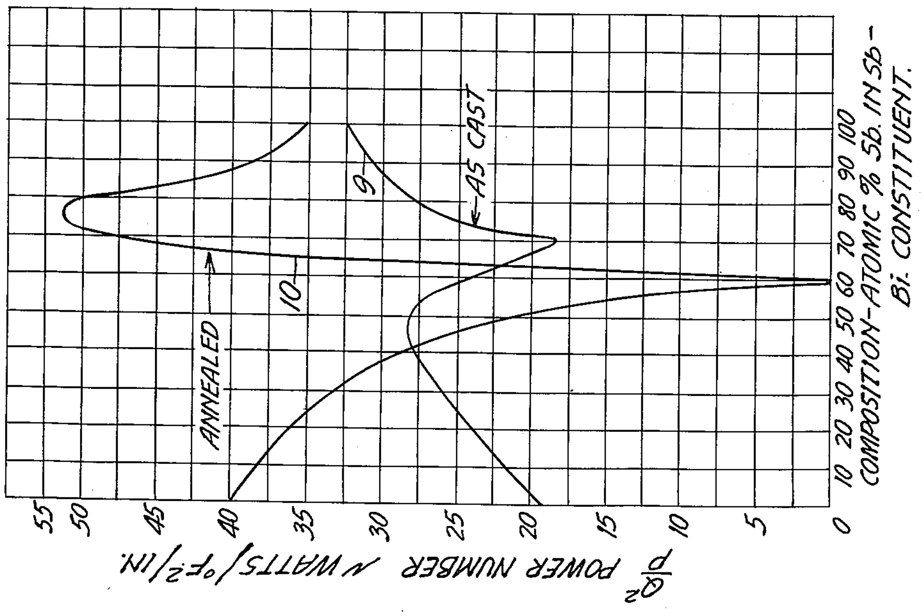
Figure 2:
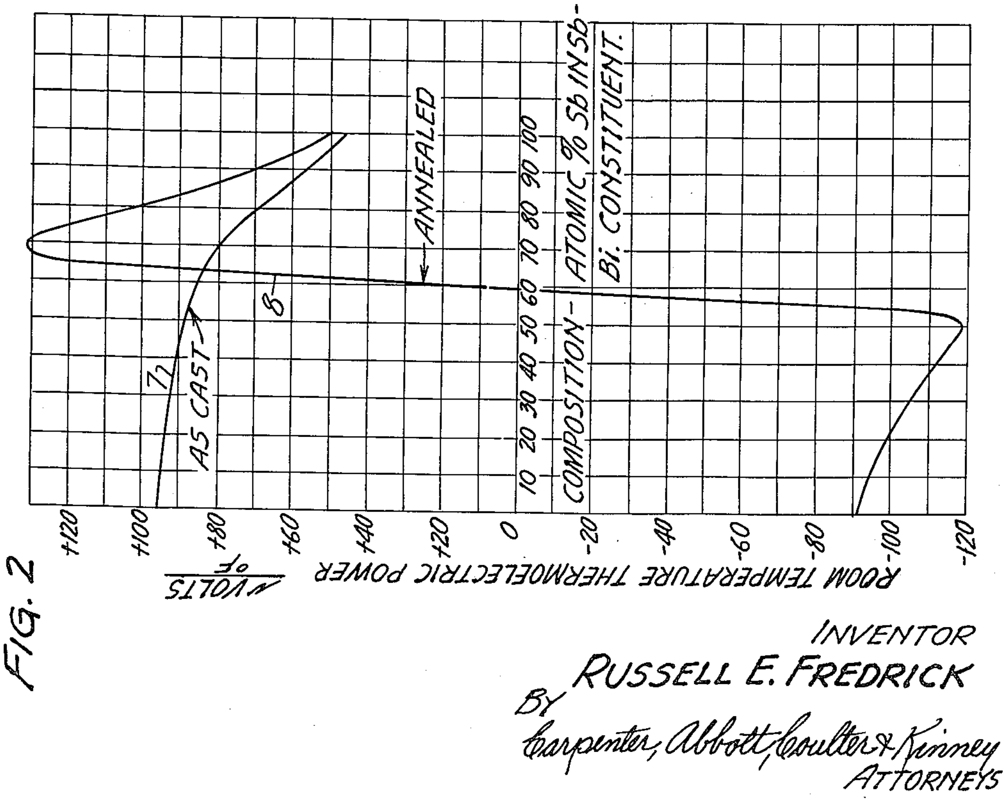

In the drawings accompanying and forming a part of this specification:

FIGURE 1 graphically illustrates the relationship of the electrical resistivity to the relative proportion of antimony in the antimony-bismuth constituents of a tellurium excess, tellurium-antimony-bismuth alloy system, and also illustrates the effect of heat treatment on the resistivity of said alloys;

FIGURE 2 graphically illustrates the thermoelectric power of the alloys depicted in FIGURE 1 and the effect thereon of heat treatment of said alloys; and FIGURE 3 graphically illustrates the power number of the alloys depicted in FIGURES 1 and 2 and the effect thereon of heat treatment of said alloys.

Referring now to FIGURE 1, the curve 5 illustrates that tellurium excess, tellurium-antimony-bismuth alloys, i.e. those in which tellurium is present within the range of 60.01 to 61.16 atomic percent, when in the as cast state, exhibit electrical resistivity which decreases gradually as the antimony-bismuth constituent varies from 100 percent bismuth to 100 percent antimony. Annealing of the compositions of FIGURE 1 effects a substantial change in the electrical resistivity thereof as represented by the curve 6. It will be observed that annealing effects a reduction in the resistivity of the compositions low in antimony, and for compositions having larger amounts of antimony, annealing effects an increase in the resistivity thereof, reaching a peak value at the composition wherein antimony constitutes 60 atomic percent of the antimony-bismuth constituent, and dropping off rapidly as the antimony-bismuth constituent approaches 100 percent antimony, at which annealing effects no substantial change in the resistivity.

Referring to FIGURE 2, the curve 7 illustrates that tellurium excess, tellurium-antimony-bismuth alloys, when in the as cast state, exhibit positive electrical conductivity over the entire range of antimony-bismuth concentrations. An appropriate annealing treatment of these compositions, however, effects a dramatic change in the thermoelectric power exhibited thereby. The curve 8 illustrates the thermoelectric power of the annealed compositions, and it will be observed that annealing effects an inversion of the electrical conductivity from P-type to N-type in compositions having less than 60 atomic percent antimony in the antimony-bismuth constituent. It will also be observed that for alloys having higher concentrations of antimony, for example from 65 to 90 atomic percent antimony in the antimony-bismuth constituent, the alloy not only retains P-type thermoelectric characteristics, but it also exhibits markedly superior thermoelectric power.

Referring to FIGURE 3, the curve 9 illustrates the power number of the tellurium excess, tellurium-antimony-bismuth alloys of FIGURES 1 and 2 in the as cast state, whereas the curve 10 illustrates the effect of annealing on the power number of the same alloys. While a substantial improvement in the power number is observed for compositions low in antimony, it will be observed that the value of the power number drops off rapidly and approaches zero at 60 atomic percent antimony in the antimony-bismuth constituent. Moreover, as previously observed, the annealed alloys in the composition range of from 0 to 60 atomic percent antimony in the bismuth-antimony constituent have N-type electrical conductivity. As further illustrated by the curve 10, the alloys possessing higher antimony concentrations, for example from 65 to 90 atomic percent antimony in the antimony-bismuth constituent, when annealed, exhibit a very substantial improvement in power number. Moreover, as aforenoted these compositions retain P-type electrical conductivity characteristics in spite of the annealing operation.

With respect to the amount of tellurium required to produce alloys having optimum electrical characteristics, the minimum amount in excess of stoichiometric proportions is of the order of 0.1 mole percent tellurium, i.e. the tellurium constitutes 60.01 atomic percent of the composition. If only the minimum amount of tellurium is used, however, a relatively long annealing period, for example 60 hours or more at 900–950° F., is required to produce a structure having uniform electrical properties throughout. Since small amounts of tellurium in excess of the aforementioned minimum do not measurably affect the electrical characteristics of the alloy, the use of additional tellurium is recommended, since it has the effect of reducing the annealing time required to produce the aforementioned uniformity of electrical properties. For example compositions containing 5.0 mole percent of tellurium in excess of the stoichiometric proportions, i.e. the tellurium constitutes 60.40 atomic percent of the composition, require annealing for approximately 12 hours at 900–950° F. When lower annealing temperatures are used, longer annealing times are required. Small changes in the composition brought about, for example by sublimation, produce no deleterious results. It is possible to use excess tellurium in amounts up to approximately 15.0 mole percent i.e. the tellurium constitutes 61.16 atomic percent of the composition, without measurably influencing the electrical properties of the alloy. When larger amounts of excess tellurium are used, however, the mechanical properties of the alloys are not reproducible, since small areas melt during the annealing operation and tend to cause dimensional instability.

Metallographically the alloys under consideration, when prepared as described herein, are essentially single phase in character with minute amounts of second phase tellurium appearing as occlusions at the boundaries of the primary phase.

In the tellurium excess, tellurium-antimony-bismuth alloy system under consideration, metallic impurities tend to move the composition at which the inversion from P-type to N-type conductivity occurs upon annealing toward lower antimony concentrations. Metallic impurities further tend to undesirably lower the thermoelectric power of the specific P-type annealed compositions. This drop in thermoelectric power is partially compensated for by a reduction in specific resistivity, so that for small metallic impurity concentrations no substantial reduction in the efficiency of the material is exhibited if a composition of somewhat smaller antimony concentration is selected to compensate for the loss of thermoelectric power due to the impurity, it being most important in the consideration of an alloy for use as a thermoelectric heat pump that the thermoelectric power be optimized. However, if it is necessary to adjust the alloy composition too much in the direction of lower antimony concentration not only may the inherent resistivity of the composition be undesirably high, but the power number may drop to an undesirable low value, so that the resultant alloy is unsatisfactory. Experience has shown that the best thermoelectric elements for heat pumping are made from alloys containing no more than 0.05 percent by weight of metallic impurities. Selenium occurs in commercially available tellurium in amounts ranging up to 0.1 percent by weight, and I have found that this amount of selenium contamination in the tellurium used does not deleteriously affect the heat pumping characteristics of the alloys under consideration.

I will now describe one method which I have found to be satisfactory for making thermoelectric elements of the tellurium excess, tellurium-antimony-bismuth alloys of the present invention. The elemental components in the proper proportions are melted together in a quartz tube, for example at red heat, and under a reducing atmosphere, and the melt is allowed to cool. The reaction product is then crushed and cast into ingots of the desired shape for thermoelectric elements in, for example, graphite molds and under a reducing atmosphere. The ingots are allowed to cool slowly, and are thereafter annealed under a reducing atmosphere for a period of from 12 hours to 60 hours at a temperature from 900–950° F., the length of the annealing time at this temperature being dependent upon the amount of tellurium excess employed in the alloy.

Thermoelectric elements made of the alloys of the present invention are characterized by superior thermoelectric properties and P-type electrical conductivity. When such elements are in thermoelectric junction with thermoelectric elements of N-type electrical conductivity also having good thermoelectric properties, a thermoelectric device is produced which has operating characteristics heretofore unattainable and which is particularly useful in heat pumping applications.

What I claim as the invention is:

1. A thermoelectric alloy consisting essentially of 60.01 to 61.16 atomic percent tellurium, substantially all of the balance being an antimony-bismuth constituent containing 65 to 90 atomic percent antimony.

2. A P-type thermoelectric alloy consisting essentially of 60.01 to 61.16 atomic percent tellurium, substantially all of the balance being an antimony-bismuth constituent containing 65 to 90 atomic percent antimony.

3. A thermoelectric alloy consisting essentially of 60.01 to 61.16 atomic percent tellurium, substantially all of the balance being an antimony-bismuth constituent containing 65 to 90 atomic percent antimony, and in which any metallic impurity does not exceed .05 percent by weight of said alloy.

4. A thermoelectric alloy having uniform electrical properties throughout and consisting essentially of 60.01 to 61.16 atomic percent tellurium, substantially all of the balance being an antimony-bismuth constituent containing 65 to 90 atomic percent antimony.

5. A P-type thermoelectric alloy having uniform electrical properties throughout consisting essentially of 60.01 to 61.16 atomic percent tellurium, substantially all of the balance being an antimony-bismuth constituent containing 65 to 90 atomic percent antimony, and in which any metallic impurity does not exceed .05 percent by weight of said alloy.

6. A pair of thermoelectric elements joined in circuit to provide a thermoelectric junction, at least one of said elements being formed of an alloy consisting essentially of from 60.01 to 61.16 atomic percent tellurium, substantially all of the balance being an antimony-bismuth constituent containing 65 to 90 atomic percent antimony.

7. A pair of thermoelectric elements joined in circuit to provide a thermoelectric junction, at least one of said elements being formed of a P-type alloy consisting essentially of from 60.01 to 61.16 atomic percent tellurium, substantially all of the balance being an antimony-bismuth constituent containing 65 to 90 atomic percent antimony.

8. A pair of thermoelectric elements joined in circuit to provide a thermoelectric junction, at least one of said elements being formed of an alloy consisting essentially of from 60.01 to 61.16 atomic percent tellurium, substantially all of the balance being an antimony-bismuth constituent containing 65 to 90 atomic percent antimony, and in which any metallic impurity does not exceed .05 percent by weight of said alloy.

9. A pair of thermoelectric elements joined in circuit to provide a thermoelectric junction, at least one of said elements being formed of an alloy having uniform electrical properties throughout and consisting essentially of from 60.01 to 61.16 atomic percent tellurium, substantially all of the balance being an antimony-bismuth constituent containing 65 to 90 atomic percent antimony.

10. A pair of thermoelectric elements joined in circuit to provide a thermoelectric junction, at least one of said elements being formed of a P-type alloy having uniform electrical properties throughout consisting essentially of from 60.01 to 61.16 atomic percent tellurium, substantially all of the balance being an antimony-bismuth constituent containing 65 to 90 atomic percent antimony, and in which any metallic impurity does not exceed .05 percent by weight of said alloy.

References Cited in the file of this patent

UNITED STATES PATENTS

| | | |
|---|---|---|
| 2,241,815 | Hensel | May 13, 1941 |
| 2,602,095 | Faus | July 1, 1952 |
| 2,762,857 | Lindenblad | Sept. 11, 1956 |
| 2,788,382 | Faus | Apr. 9, 1957 |
| 2,834,698 | Newport | May 13, 1958 |
| 2,953,616 | Pessel et al. | Sept. 20, 1960 |
| 2,957,937 | Jensen et al. | Oct. 25, 1960 |